United States Patent [19]

Russell

[11] 4,342,958
[45] Aug. 3, 1982

[54] AUTOMATIC TEST EQUIPMENT TEST PROBE CONTACT ISOLATION DETECTION METHOD

[75] Inventor: Robert J. Russell, South Boston, Mass.

[73] Assignee: Honeywell Information Systems Inc., Waltham, Mass.

[21] Appl. No.: 134,809

[22] Filed: Mar. 28, 1980

[51] Int. Cl.³ .................. G01R 31/02; G01R 15/12
[52] U.S. Cl. ............................... 324/73 R; 324/51; 324/158 P
[58] Field of Search ............ 324/73 R, 73 PC, 73 AT, 324/158 R, 158 P, 51

[56] References Cited

U.S. PATENT DOCUMENTS

3,721,899 3/1973 Haywood .............................. 324/51
3,867,693 4/1975 Saxenmeyer, Sr. ............... 324/73 R Primary Examiner—Gerard R. Strecker
Assistant Examiner—Walter E. Snow
Attorney, Agent, or Firm—William A. Linnell; Nicholas Prasinos

[57] ABSTRACT

A method for determining whether test probes of a test fixture on an automatic test equipment (ATE) device are in contact with the intended test points on an electronic assembly under test. The undetected failure of the test probes to contact the test points on the electronic assembly test, such as a printed circuit board can result in meaningless test results or lead to unnecessary further testing or replacement of nonfaulty components that tested as failed. The method is directed to detecting which test probes are not in contact with their corresponding test points on the electronic assembly undergoing test by ATE.

13 Claims, 4 Drawing Figures

AUTOMATIC TEST EQUIPMENT TEST PROBE CONTACT ISOLATION DETECTION METHOD

CROSS-REFERENCE TO RELATED APPLICATIONS

The following patent application, which is assigned to the same assignee as the instant application has been filed on an even date with the instant application, and has related subject matter:

| TITLE | INVENTOR | SERIAL NO. |
| --- | --- | --- |
| Automatic Test Equipment Isolation Test Point Detection Apparatus and Method | Robert J. Russell | 134,808 |

BACKGROUND OF THE INVENTION

1. Field of the Invention

The present invention relates generally to automatic test equipment for testing electronic assemblies, and more particularly to a method for the testing of electronic assemblies such as printed circuits and the in-circuit testing of electronic components.

2. Description of the Prior Art

With the advent of larger and larger printed circuit boards (PCB) containing more and more signal paths and electronic components and the use of more and more complex electronic components on printed circuit boards, the need for automatic testing of such printed circuit boards has become a matter of economic necessity. Detection of failures in printed circuit boards at the earliest possible stages of manufacture prior to their being installed in the ultimate product or the investment of more and more labor and material cost is a common goal of most printed circuit board manufacturing processes. Automatic testing equipment has been introduced for the purpose of detecting faulty components and assembly errors at the printed circuit board level so that problems can be found at the printed circuit board level before a series of boards are assembled into a subassembly and subassemblies into systems.

In a typical manufacturing process, a system containing printed circuit boards may undergo one or more of the following tests or inspections. The printed circuit itself will be ring-out tested before electronic components are mounted on the board to assure that signal paths (etches) connect all required points and that there are no shorts between signal paths. After the electronic components are mounted and soldered to the printed circuit, a second ring-out test is performed to again verify signal path continuity and that there are no shorts between signal paths. Next the printed circuit boards with the electronic components mounted may then be placed in a thermal chamber and/or subjected to a burn-in period. Burn-in is performed by applying power to the printed circuit board and exercising the printed circuit board logic. This may be done while the PCB is in the thermal chamber and cycled through a range of temperatures. The purpose of the thermal chamber and/or burn-in periods is to make marginal connections and electronic components fail before subsequent testing. The heat and exercising stimulus cause marginal connections and electronic components to fail in a much shorter period that would otherwise be required. These failures can then be identified by subsequent testing prior to installing the printed circuit board in the ultimate product where their eventual failure may be very costly both in repair time and down time.

Following the terminal chamber and/or burn-in period, the printed circuit boards are then subject to a second set of tests which are usually performed by mounting the printed circuit board on an automatic test equipment device and cycling through a set of tests. Tests in this second set include: testing for shorts, analog testing, testing component orientation, and digital testing. The shorts test checks for shorts between signal paths by introducing a low impedance signal on one path and testing for its presense on other signal paths. The component orientation test checks for components being properly mounted on the PCB, i.e., that integrated circuits have been properly oriented without lead reversal. The digital testing checks are performed on integrated circuits by using truth tables to apply known input signals so that the outputs can be checked against expected results. For example, a known pattern can be placed in a shift register and the output monitored as the register is shifted (clocked). Analog testing is used on discrete components such as resistors, diodes, transistors and capacitors to verify that they are of the proper value (ohms, etc.) and that they perform as expected.

Some of these test are performed without power on the electronic assembly and others are performed with power. For those performed with power, the various voltage and ground paths on the printed circuit board are connected to the various voltage and ground potentials that will be applied to the PCB when it is in use in the ultimate product, and the tests are run with the electronic components operating under power. For example, if a PCB containing TTL electronic components will have ground, +5 volts DC, and +12 volts DC applied to it in the ultimate product, the ground lead will be attached to ground, the 5 volt DC lead will be supplied with +5 volts DC and the 12 volt DC lead will be supplied with +12 volts DC when the component orientation and digital tests are performed. The digital test may also be performed with other marginal voltages applied to test for marginal components.

Other tests such as the shorts and analog testing are performed without power applied to the PCB. These tests are usually performed before the other tests so that power is applied only after faults that could cause other components to fail when power is applied have been identified and corrected. It should be noted that the earlier described ring-out testing (without and with components mounted) is performed without power applied to the PCB.

As printed circuit boards become larger and more complex the test points, to which automatic test equipment must have access, are no longer accessible by signal paths brought out to edge connectors on a printed circuit board. The automatic testing equipment must have access to points within the board to do ring-out testing to check that an etch (signal) path does in fact connect all the points that it is supposed to without discontinuities and that it is not shorted with other parallel paths. To gain access to these internal test points, automatic test equipment has been designated such that the PCB to be tested is placed in a fixture containing a matrix of spring loaded test probes which are placed to contact the PCB at the desired test points on the PCB. In addition to being spring loaded, test probes may be gold plated to provide good conductivity by reducing corrosion and resistance. To further aid in providing positive contact, a variety of test probe head designs are available to probe test points such as integrated circuit pins, PCB lands (an exposed area of copper etch on the PCB surface), extended leads, thin etch traces and others. One such test fixture is the Thinline system manufactured by Fairchild Test System Group, Subassembly Test System Division, Latham, N.Y. 12110. Thinline is a registered trademark of Fairchild. This test fixture system holds the PCB in the fixture by use of a vacuum.

Unfortunately, as good as fixturing systems are on present automatic test equipment, the failure of a test probe in the fixture to make contact with the test point on the PCB will greatly effect the test results and consequently the use that can be made of the ATE results. Test probe contact failure can be caused by: misalignment of the PCB on the fixture, individual misaligned test probes, bent or missing probe pins, dirt or other foreign matter on the PCB at the test point, a discontinuity in the signal path between the test probe and the sensing circuit in the ATE (e.g., broken wire, nonclosing relay), etc. This problem can be ameliorated in some cases by using multiple test probes for each test point on the PCB. However, this is not always possible due to space limitations on the PCB itself, or limitations on the total number of test probes in a fixture or connectable to (testable by) the ATE.

This failure of one or more test probes to make contact becomes more likely as the size of the PCB increases and as more components are mounted on a PCB. For example, in a present day minicomputer, a typical PCB containing the central processing unit logic or peripheral controller logic may be approximately 15 by 13 inches in size, have approximately 300 electronic components mounted on it, and have approximately 1100 test points. Some of these test points on particularly long or common signal (etch) pulses may go to as many as 30 places on the PCB and therefore be involved in testing many electronic components on the PCB.

The results of testing the PCB by the ATE may be presented to the user as a printout which indicates which component (e.g., the resistor at location B3) on the PCB failed a particular type (analog, digital, etc.) of test. As a matter of economy and production efficiency, it has been found in some cases that the more automated the test is and the lower the skill level of the ATE operator, the more reliable the test results. This results from the fact that more highly skilled operators tend to want to improve the test results by trying various things to overcome poor test results. This improving process often slows down test production and/or leads to decreased reliability in the results as the skilled operator tries various fixes to cure the problem.

The use that is made of the test results varies widely depending on testing and repair philosophy, the confidence level placed in the test results, and the skill level of the person who interprets the test results, the complexity of the PCB, the skill level of the person who is to remove and replace identified faulty components, component and labor costs, etc. For example, at one extreme the test results can be put aside and used only as an aid to repairing the PCB after the PCB fails in a subsystem or system test. The test results may be used to guide a visual inspection in which the inspector simply verifies that components that failed the tests are the proper components and properly oriented. Alternatively at the other extreme, all components identified by the ATE tests can be systematically removed from the PCB and replaced by new components. Unfortunately, with large complex printed circuit boards, this remove and replace philosophy may not be economical in terms of labor and component costs if the ATE results are not 100 percent reliable. Further, with unreliable test results, this remove and replace philosophy may not be a converging process in that removal of the identified faulty component from a wave soldered PCB with fine etch signal paths may result in damage to the PCB itself which can lead to the introduction of more failures into the PCB than are removed at any one pass of the PCB through the inspection process.

Therefore, what is needed is a method for automatic testing of electronic assemblies which improve the reliability and useability of ATE test results.

OBJECTS OF THE INVENTION

It is therefore a principle object of the present invention to provide a method which may quickly and economically determine which test probes of automatic test equipment are not in contact with the test points of the electronic assembly under test.

Another object of the present invention is to provide a method which detects noncontacting test probes, isolates to affected components, and permits easy correlation of noncontacting test probes to the results of other tests performed under conditions which could be the result of some test probes not being in contact with their corresponding test points on an electronic assembly under test.

SUMMARY OF THE INVENTION

In accordance with the present invention, there is provided a method for operating an ATE device to detect isolated test probes. In carrying out a test of an electronic assembly, the electronic assembly is mounted in a test fixture containing a plurality of test probes connected to the test stimulation and sensing devices. The test sequencing device sequences those series of test applying predetermined test stimulants to predetermined test probes and sensing the results of the stimulus at predetermined other test probes. During the test sequence, a test is performed to detect any test point that is not connected to the sensing device due to test probe not being in contact with its corresponding test point on the electronic assembly probe and the sensing device. This test point isolation test is performed by first applying a short duration stimulation pulse to the corresponding test probe and sensing a plurality of test points which are common to most components on the electronic assembly under test (such as ground and voltage supply signal paths). If a response is sensed at the common test points, the test point associated with the test probe is not isolated and the isolation test is performed on the next test probe. If no response is received at the common test points, the polarity of the stimulation pulse is reversed by applying it to the common test points and sensing for a response at the test probe which is undergoing test to determine if it is isolated. A response within predetermined limits at any of the test probes on the common points is interpreted as an indication that the test probe whose isolation is being checked is in contact with its corresponding test point. The isolation of each test point is checked and each test point found to be isolated is indicated on the test result display device. The results of this isolated test point detection test can then be either manually or automatically correlated to the various components mounted in the electronic assembly under test and taken into account in interpreting other test results from tests performed (while the electronic assembly remained mounted in the test fixture and in the test position) which may have identified such components as faulty.

The detection of isolated test points in the automatic testing of electronic assemblies is a material advantage in being able to interpret other test results and significantly contributes to the ability to rapidly and economically repair faulty assemblies by removal and replacement of truly faulty electronic components with a higher degree of reliability than would otherwise be realized.

Another advantage of the present invention is that the detection of isolated test points is accomplished by a process that does not require extensive analysis of the signal paths of the electronic subassembly to be tested. Analysis is required only to identify common test points which can be used as stimulation injection and sensing points as the isolation of the individual test points is checked.

A still further advantage of the present invention is that detection of isolated test points is rapid and cost effective and does not inordinately increase overall testing time of a particular electronic assembly.

These and other objects and advantages of the present invention will become more apparent and better understood to those of ordinary skill in the art when taken in conjunction with the following description of the preferred embodiment illustrated in the several figures of the drawings.

BRIEF DESCRIPTION OF THE DRAWINGS

The manner in which the apparatus of the present invention is constructed and its mode of operation can best be understood in light of the following detailed description taken together with the accompanying drawings in which like reference numerals identify like elements in the several figures and in which.

DESCRIPTION OF THE PREFERRED EMBODIMENT

The instant invention provides a practical means of identifying test probes of a test probe fixture associated with an automatic test equipment device which failed to make contact with their corresponding test point on an electronic assembly under test. The detection of isolated test points by the present invention allows, the primary test results to be interpreted in light of the detection of isolated test points. The development of the method of the present invention was based upon the practical evidence that test probe contact failures affecting automatic test equipment test results of most types of electronic assemblies are almost always involved in extremely high impedance. This evidence indicated that the vast majority of contacts between the test probe and the test points on the electronic assembly undergoing test could, for all practical purposes, be characterized by shorts or opens, with only a small minority falling into a category which might be called marginal or resistive. Evidence also indicated that the vast majority of test points on the electronic assemblies under test were coupled, in at least some marginal fashion, to some other test point on the electronic assembly. Based on this evidence the conclusion was reached that the measurement of anything but an extremely high impedance between two test probes can be interpreted as an indication that both test probes were making proper contact with their corresponding test points on the electronic assembly and that this conclusion could be relied on with a high level of confidence.

Equipment needed to implement the method of the present invention may vary greatly depending upon the extent to which the automatic test equipment device must be modified to accommodate the isolated test point detection method in addition to its normal test cycle. To perform a manual check between two test points, however, only a signal source and a high impedance detection device are required. For maximum benefit, the signal source should be capable of switching polarity to allow maximum current passage through semiconductor devices and to have a fast enough rise time to allow maximum current passage through capacitance devices. The signal source (pulse generator) and high impedance detection device (pulse detector) should be adjustable so that the greatest number of test points may be tested on a particular electronic assembly while still allowing the greatest protection against false detection of an isolated test point.

Figure 1:
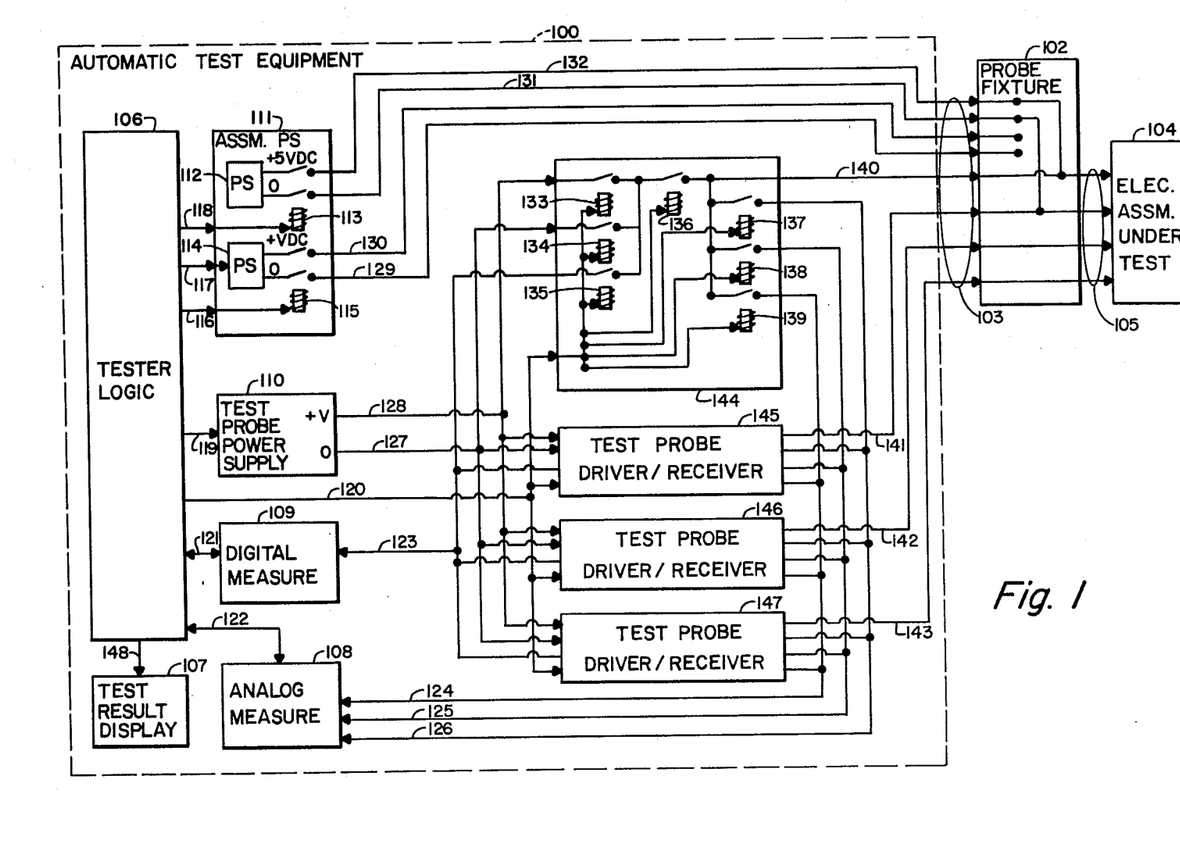
FIG. 1 is a logic block diagram of an ATE device capable of practicing the method of the present invention.

FIG. 1 is a logic block diagram of an automatic test equipment device capable of practicing the method of the present invention. An example of an automatic test equipment device having the features illustrated in FIG. 1 is the Fairchild FF303 in-circuit test system for complex PCBs manufactured by Fairchild Test Systems Group, Latham, N.Y. 12110 which is more fully described in their publications *FF303 Maintenance Manual*, dated May 5, 1978, and the *FF303 Specifications, Universal Computer-Based In-Circuit and Functional Printed Circuit Board Test System*, Rev. 1.0, dated Feb. 1, 1977, both of which are incorporated herein by reference. FIG. 1 illustrates automatic test equipment device 100 connected to a test probe fixture 102 via fixture bus 103. Test probe fixture 102 contains a plurality of test probes 105 which are to be placed in contact with the electronic assembly under test 104. In a typical automatic test equipment system the probe fixture for probing PCBs may contain approximately 1200 test probes 105, four of which are illustrated in FIG. 1. Automatic test equipment 100 tests the electronic assembly under test 104 by stimulating the components on the electronic assembly under test and measuring the response which is then analyzed and displayed so that the electronic assembly may be passed through inspection or repaired and retested.

The major elements of automatic test equipment 100 are the tester logic 106, the electronic assembly power supply 111, test probe power supply 110, digital measurement unit 109, analog measurement unit 108, test result display 107, and test probe driver/receivers 144 through 147. It being noted that only four test probe drivers/receivers are illustrated, each of them corresponding to one of the test probes 105 rather than the 1200 test probe drivers/receivers that would be in an ATE device with 1200 test probes. Tester logic 106 controls the rest of the automatic test equipment device and sequences the various tests to be performed on the electronic assembly under test 104 and analyzes the results reported back by digital measurement unit 109 and analog measurement unit 108 and reports the results to test result display 107. In a typical system, tester logic 106 may be a minicomputer having, for example, 64 K words of memory and test result display 107 may be a printer which prints out the results of the tests run on the electronic assembly 104. Electronic assembly power supply 111 may consist of one or more power supplies, the output of which is used to provide power to the electronic assembly under test 104 when a test is to be run which requires that the electronic assembly have power supplied to it. An example of a test which requires power to be supplied to the electronic assembly under test 104 is a truth table test being run on integrated circuits in which case the power is supplied to the PCB and the individual inputs and outputs leads (pins) of the integrated circuit which is being checked will be stimulated and measured by the various test probes.

FIG. 1 illustrates an electronic assembly power supply 111 which contains two power supplies. Power supply 112 is illustrated to be a power supply which outputs a +5 volts DC on line 132 and 0 volts DC on line 131. The +5 volts DC line 132 is connected within the test probe fixture 102 to the top test probe of test probes 105. Similarly, the 0 volts DC on line 131 is connected within test probe fixture 102 to the second from the top test probe of test probes 105. Because some tests are performed with power applied to the electronic assembly under test and other tests are performed without power supplied to the electronic assembly under test, relay 113 within electronic assembly power supply 111 provides for control of whether the power from power supply 112 will be applied to the top two test probes of test probes 105. Relay 113 is controlled by the signal appearing on line 118 from tester logic 106 thus providing for the test program to control whether power is supplied to the electronic assembly under test or not.

In addition to the +5 volt power supply 112 within electronic assembly power supply 111, a second variable voltage power supply 114 is provided which provides a programmed positive voltage on line 130 and a 0 voltage on line 129, both of which are also connected to test probe fixture 102. The actual level of the positive voltage supplied by power supply 114 is controlled by the test program executed by tester logic 106 via line 117. Again as in the case of power supply 112, the output of power supply 114, can be selectively connected to the test probe fixture under the control of relay 115 via line 116. The variable power supply 114, for example, may be programmable to output a voltage on line 130 from 0 to +60 volts. FIG. 1 illustrates that the output of power supply 114 which is connected to test probe fixture 102 is not connected within the test fixture to any of the four example test probes. In the example automatic ATE device of FIG. 1, relays 113 and 116 are mechanical relays.

Test probe power supply 110 is used to provide the test stimuli to the electronic assembly under test 104. Test probe power supply 110 in the example system is a programmable power supply with the level of the +V voltage under the control of the test program via line 119 from tester logic 106. The +V voltage from power supply 110 appears on line 128 and the 0 voltage from the power supply appears on line 127. Lines 127 and 128 are connected to each of the test probe driver/receivers 144 through 147 such that each test probe of test probes 105 may have either the positive voltage or the 0 voltage level applied to the test probe.

Digital measurement unit 109 is a high impedance measuring device capable of detecting a positive voltage appearing on digital bus line 123 which is connected to each of the test probe driver/receivers 144 through 147. As will be seen hereinbelow, at any given time, only one test probe of test probes 105 is connected to digital bus line 123. The output of digital measurement unit 109 is reported to the tester logic 106 via line 121 for analysis and possible correlation of test results to a particular component on the electronic assembly under test which is being tested. Analog measurement unit 108 is connected to analog bus lines 124, 125, and 126, and is used to measure the analog test results of components on the electronic assembly under test 104. The output of analog measurement unit 108 is reported to the tester logic 106 via line 122. Test result display 106 is used to display the results of testing electronic assembly 104 and may be a light panel, a meter panel, or a printer as in the example case and is connected to the tester logic 106 via line 148.

The test probe driver/receivers 144 through 147 of FIG. 1 will now be discussed in detail. Within a typical automatic test equipment 100 there is one test probe driver/receiver for each test probe of test probes 105. FIG. 1 illustrates that test probe driver/receiver 144 is connected to the top test probe of test probes 105. Similarly, test probe driver/receiver 145 is connected to the second from the top test probe of test probes 105 via line 141. Test probe drivers 144 through 147 are of identical construction and the systems having 1200 test probes will have 1200 test probe driver/receivers.

FIG. 1 illustrates the connections within test probe driver/receiver 144 in greater detail that that shown for test probe driver/receivers 145 through 147. By examining test probe driver/receiver 144 it can be appreciated that positive voltage on line 128 from test probe power supply 110 may be connected to test probe line 140 via closing relay 133 and closing relay 136. Alternatively, the 0 voltage from test probe power supply 110 on line 127 may be connected to test probe line 140 via closing relays 134 and 136. Thus it can be appreciated that by closing relay 133 or 134 in conjunction with relay 136, either a positive voltage or a 0 voltage level may be applied to the test probe connected to line 140 which is the top test probe of test probes 105. Relays 133 and 134 are in actuality transistors which control whether a positive voltage or a 0 voltage level or no connection at all to test probe power supply 110 is made within test probe driver/receiver 144. Relay 136 is a mechanical relay and controls whether the test probe connected to line 140 is connected to test probe power supply 110 and/or digital measurement until 109 and is used to ensure isolation during analog measurements. When both relays 136 and 135 are closed, the test probe connected to line 140 is connected to the digital measurement unit 109 via line 123. Relay 135 is a CMOS relay (electronic switch) and the introduction of its impedance is relatively insignificant in comparison to the high impedance of digital measurement unit 109. Mechanical relays 137, 138, and 139 are used to connect the test probe via line 140 to the analog measurement unit 108 via lines 126, 125, and 124 respectively. Relays 133 to 139 are all under the control of the test program executed in tester logic 106 and may be individually closed or opened as a function of signals appearing on control lines 120.

Although not illustrated in FIG. 1 for the purposes of simplicity, test probe driver/receivers 145 through 147 have a corresponding set of relays to those illustrated for test probe driver/receiver 144 and also may be independently controlled by signals on control lines 120 from the test program of tester logic 106.

As an example of the use of automatic test equipment device 100 it can be appreciated that to measure the resistance of a component on the electronic assembly under test 104 it is possible to connect the test probe in contact with one lead of the resistive component to one of the lines leading to analog measurement unit 108 and the test probe in contact with the other lead of the resistive component to another line leading to analog measurement unit 108. For example, if the resistive component to be measured is connected between the top and the second from the top test probes of test probes 105, the closing of relay 137 will connect the top test probe to the analog measurement unit 108 via line 126. Similarly, the second from the top test probe of test probes 105 may be connected to the analog measurement unit 108 via line 124 by closing the relay in test probe driver/receiver 145 which corresponds to the relay 138 of test probe driver/receiver 144. Thus, by closing these two relays, the resistance between the top and the second from the top test probes of test probes 105 may be measured by analog measurement unit 108 and reported to tester logic 106 via line 122.

Continuing with the discussion of FIG. 1, the digital measurement capabilities of automatic test equipment device 100 will now be discussed. The proper operation of digital components on electronic assembly 104 may be tested by applying ATE ground referenced power to the electronic assembly, applying specifically known input values to the inputs of the digital component, and measuring the response at the output of the digital component; for example, assuming that electronic assembly 104 is printed circuit board containing an integrated circuit which has an inverter in it, if relay 113 of electronic assembly power supply 111 is closed a +5 volts DC will be applied to the top test probe and 0 volts DC will be applied to the second from the top test probe of test probes 105. If these top two test probes are in contact with the positive voltage path in the printed circuit board and the ground path in the printed circuit board, both the necessary power connections will be made to the integrated circuit under test. Further, if the third from the top test probe of test probes 105 is connected to the input of the inverter then if the relay corresponding to relay 133 is closed in test probe driver/receiver 146 a positive voltage (or a binary ONE signal) can be applied to the inputs of the integrated circuit under test via line 142 if the relay corresponding to relay 136 is closed in test probe driver/receiver 146. It being noted in this example that the relay 136 in test probe driver/receiver 144 and the corresponding relay in test probe driver 145 need not be closed because the top two test probes of test probes 105 are being used to supply the +5 and 0 volts to the PCB under test. Now, by closing the relays in test probe driver/receiver 147 which corresponds to relays 135 and 136 of test probe driver/receiver 144, the bottom test probe of test probes 105 will be connected to the digital measurement unit 109 via line 123 and the output of the inverter within the integrated circuit under test can be measured to see whether it is, in fact, a binary ZERO and the test results reported to tester logic 106 via line 121.

Thus it can be appreciated that the relays corresponding to relay 136 can be used to select test probes of test probes 105, that the relays corresponding to relay 133 can be used to supply a positive voltage to a selected test probe, that the relays corresponding to relay 134 can be used to supply a zero voltage to selected test probes and that the relays corresponding to relay 135 can be used to select a test probe to be connected to digital measurement unit 109. The relays that correspond to relay 133, which in actuality are transistors, are controllable such that none, one, or multiple test probes may have the positive voltage from test probe power supply 110 applied to the test probes which have their relays corresponding to relay 136 closed. Similarly, relays 134 are controllable via tester logic 106 such that none, one, or multiple test probes may have the 0 voltage level from test probe power supply 110 applied to the test probes which have their relays corresponding to relay 136 closed. Relays 133 and 134 which as mentioned before are transistors are controllable by tester logic 106 via control lines 120 such that they may be latched (or closed permanently) or they may be closed and then opened thus allowing a pulse of positive or zero voltage to be applied to the test probes. Depending upon the specification of the particular automatic test equipment device 100, the length of the duration of these voltage pulses may be controllable by the test program from a duration of, for example, a few microseconds to a matter of milliseconds. The purpose of the relays corresponding to relay 136 is to separate the digital section of the test probe driver/receivers from the analog section such that signals appearing on lines 123, 127, and 128 will be isolated from any signals coming from test probes being used for analog measurement and not be transmitted to lines 124, 125, and 126 connected to analog measurement unit 108. Thus the relays corresponding to relay 136 will be open when their associated test probes are being used in analog measurement. The construction of the example automatic test equipment device 100 is such that only one of the relays corresponding to relay 135 may be closed at any time such that only one test probe at a time of test probes 105 may be connected to digital measurement unit 109 via line 123.

In summary it can be appreciated that individual test probes of test probes 105 may be connected to the electronic assembly power supply 111 by making a connection within test probe fixture 102 to the appropriate power lines 129 through 132, may be connected to the test probe power supply 110 positive voltage or zero voltage by closing the relays corresponding to relays 133, 134 and 136, and that such connection may be either a latch connection or a momentary connection thus supplying either a steady voltage or a voltage pulse, that they may be connected to digital measurement unit 109 via line 123 by closing the relays corresponding to relays 135 and 136 or they may be connected to analog measurement unit 108 via lines 124, 125, and 126 by closing the relays corresponding to relays 137, 138, and 139 and opening the relays corresponding to relay 136. Thus it can be further appreciated that the automatic test equipment device 100 has the ability to supply power to the power paths within the electronic assembly under test, to supply steady voltages to signal paths within the electronic assembly under test, and to supply pulsing voltage signals to the electronic assembly under test, or to make digital or analog measurements on the electronic assembly under test.

Before describing in detail a method for detecting whether a test probe of the test probes 105 is in fact making good contact with its corresponding test point on the electronic assembly under test 104 an example of an electronic assembly in the form of a printed circuit board will be described.

Figure 2:
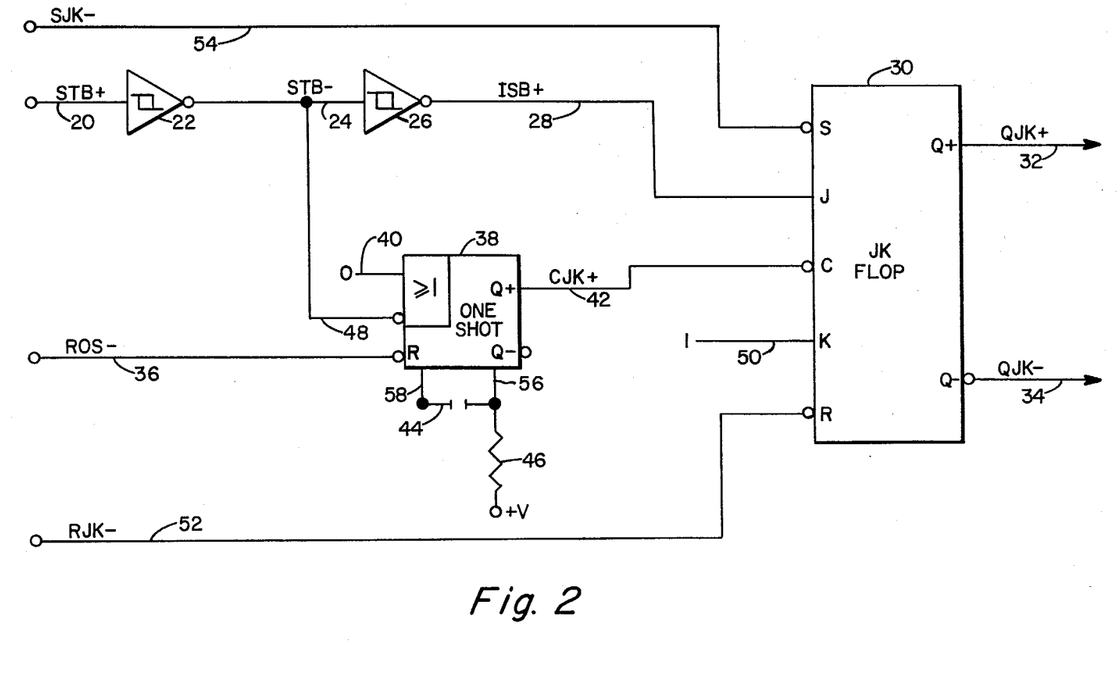
FIG. 2 is a logic block diagram of an example electronic assembly to be tested using the method of the present invention; and, FIG. 3 is the PCB corresponding to the logic block diagram of FIG. 2 and illustrates an example electronic assembly to be tested using the method of the present invention.
Figure 3:
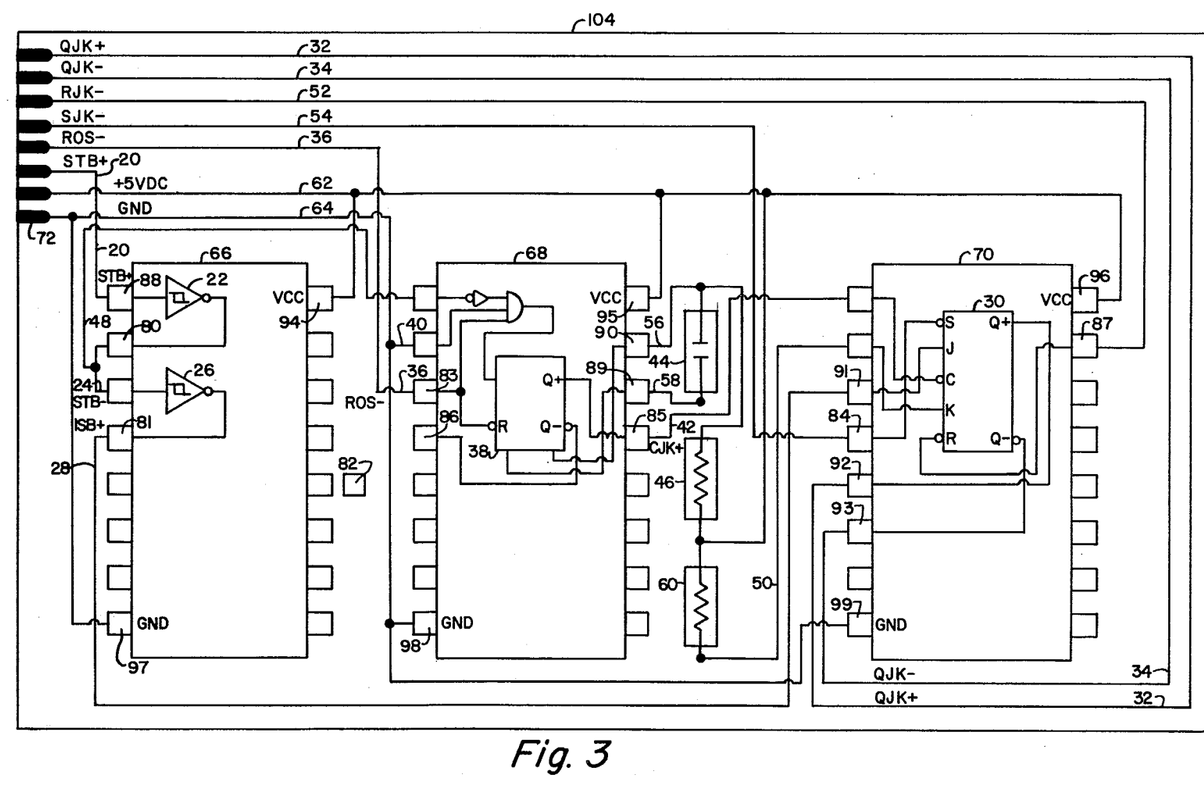

As an example of the detection of isolated test points in an electronic assembly the circuit of FIGS. 2 and 3 will be discussed. FIG. 2 illustrates a simplified logic diagram of the example circuit. FIG. 3 illustrates an example printed circuit board used to implement the circuit of FIG. 2 using TTL integrated circuits and several discrete components.

The example circuit of FIG. 2 shows two Schmitt-triggered inverters, a retriggerable monostable multivibrator (one shot) and a JK negative edge triggered flip-flop with preset and clear. Basically, the example circuit functions to set JK flip-flop 30 if a strobe signal STB+ on line 20 is of sufficient duration such that it is still in the binary ONE state (high) when one shot 38 times out and clocks the JK flip-flop 30. Strobe input signal STB+ on line 20 is inverted by inverter 22 and outputs inverterted strobe signal STB− on lines 24 which is then inverterted by inverter 26 which outputs twice inverted strobe signal ISB+ on line 28. Inverted strobe signal STB− also goes to the inverted input (indicated by a circle at the input) of one shot 38 and will trigger the one shot. The other noninverted trigger input to one shot 38 is a binary ZERO on line 40. Once triggered, one shot 38 will output a binary ONE on the Q+ output, signal CJK+ on line 42, which will be maintained until the one shot times out. The time out or delay period of one shot 38 is determined by the values of capacitor 44 and resistor 46 which are connected to inputs by lines 56 and 58. One end of resistor 46 is connected to +V volts DC which is typically +5 volts DC. When one shot 38 times out, its output signal CJK+ on line 42 will transition from the binary ONE to the binary ZERO state and will clock JK flip-flop 30. If the strobe signal is still a binary ONE when one shot 38 times out, signal ISB+ on line 28 at its J input will be a binary ONE and the JK flip-flop will toggle because the K input is also a binary ONE on line 50. If the JK flip-flop was previously reset it will set and the Q+ output, signal QJK+ on line 32, will go from the binary ZERO to the binary ONE state and the Q− output, signal QJK− on line 34, will go from the binary ONE to the binary ZERO state. Signals SJK− on line 54 and RJK− on line 52 are normally in the binary ONE state but can be used to set or reset the JK flip-flop by momentarily setting one or the other to the binary ZERO state. In a similar manner, signal ROS− on line 36 is normally a binary ONE at the reset input of one shot 38 and can be used to reset the outputs. Only the Q+ output of one shot 38 is used and the Q− output is not used.

Turning now to FIG. 3, the printed circuit board which implements the logic diagram of FIG. 2 is illustrated. In FIG. 3 one can better appreciate how the signal paths of FIG. 2 might be implemented in copper etch paths. It being noted that because the etch paths cross over each other that the PCB of FIG. 3 would be implemented using a multilayer PCB in order to maintain signal path isolation where paths cross each other. An examination of FIG. 3 will reveal that all the signal paths and electronic components found in FIG. 2 are present and additionally there are other paths and elements. For example, FIG. 3 illustrates the voltage paths which are used to power the integrated circuits mounted on the PCB. The ground path on line 64 runs to the ground (GND) pin of each of the integrated circuits 66, 68 and 70. In addition, the +5 volts DC path runs to the voltage (VCC) pin on each integrated circuit 66, 68 and 70 and to one lead of resistors 46 and 50.

Integrated circuit 66 is a hex Schmitt triggered inverter of the type SN74LS14 manufactured by Texas Instruments Incorporated (TI) of Dallas, Tex. 75222 and contains 6 inverters of which only inverters 23 and 26 are shown because only two of the six are used in the example circuit of FIG. 2. Integrated circuit 68 is a dual retriggerable monostable multivibrator of the type SN74LS123 also manufactured by TI and contains two one shots of which only one shot 38 is shown because only one is used in the example circuit of FIG. 2. Integrated circuit 70 is a dual JK negative edge triggered flip-flop with preset and clear of the type SN74LS112 also manufactured by TI and contains two JK flip-flops of which only one is used in the example circuit of FIG. 2. Inverters 22 and 26, one shot 38 and JK flip-flop 30 are further described in *The TTL Data Book for Design Engineers*, Second Edition, copyrighted 1976, by Texas Instruments Incorporated of Dallas, Tex. 75222, which is incorporated herein by reference.

In addition to the descrete components of capacitor 44 and resistor 46 illustrated in FIG. 3 and also shown in FIG. 2, a second resistor 60 has been added to provide the binary ONE input at the K input of JK flip-flop 30. One end of resistor 60 is connected to the K input of flip-flop 30 via line 50 and the other end of the resistor is connected to the +5 volt DC line 62. The binary ONE on line 40 at the input of one shot 38 of FIG. 2 is provided in FIG. 3 by connecting line 40 to the ground voltage path 64. Input signals SJK−, STB+, ROS−, and RJK− on lines 54, 20, 36, and 52, and output signals QJK+ and QJK− on lines 32 and 34 are brought out to the edge of the printed circuit board illustrated in FIG. 3 with an enlarged area of copper 72 as illustrated at the end of ground path 64. These finger areas such as finger 72 are enlarged portions of copper at the edge of the printed circuit board which will be plugged into an edge connector within the ultimate product and provide logic signals and power to the printed circuit board.

In normal practice the printed circuit boards are constructed such that all components are mounted on one side of the printed circuit board with their pins and leads wave soldered to the printed circuit board by providing an area of copper around each pin or lead. These areas of copper are referred to as lands. Thus in FIG. 3 the small squares forming parallel columns at the edge of integrated circuits 66, 68, and 70 represent the pins from the integrated circuits and each would have a land on the opposite side of the printed circuit board.

The usefulness of the present invention can be appreciated by referring to FIG. 2 and noting that all of the test points for which it might be desirable to probe in testing the printed circuit board of FIG. 3 are not available for an edge connector; for example, the output of one shot 38, signal CJK+ on line 42, is not available as a signal available at the edge of the printed circuit board illustrated in FIG. 3 and therefore a test point somewhere on line 42 must be probed by a test probe. Further, even if all signals were available at the edge of the printed circuit board thereby allowing the board to be fully tested by connecting it to an edge connector, the possibility still exists that the edge connector is not, in fact, in contact with the test points. The present invention can be used to determine whether a test point is isolated, whether the test probe fixture is an edge connector or a spring loaded test probe matrix.

To fully test the circuit of the printed circuit board as illustrated in FIG. 3, the printed circuit board could be placed in a test probe fixture 102 of the type illustrated in FIG. 1 such that the printed circuit board of FIG. 3 becomes the electronic assembly under test 104 of FIG. 1 and would be in contact with test probes 105. The printed circuit board 104 would be placed in the test fixture such that the components mounted on the one side of the printed circuit board would be exposed and the opposite side of the board would be in contact with the test probes 105. For illustrative purposes a set of 19 test points have been identified within the circuit of FIG. 2 and are illustrated on a printed circuit board 104 of FIG. 3 as numbered test points 80 through 99. Each of these test points would have a corresponding test probe of test probes 105 which was intended to be in contact with the land on the opposite side of the printed circuit board to which the various pins and leads of the components are soldered. For example, test point 88 on the opposite side of the printed circuit board will provide its corresponding test probe with access to the signal STB+ on line 20.

In addition to providing access to the logical signals of the circuit, some of the test points in FIG. 3 provide access to the +5 volt DC path within the printed circuit board and the ground voltage path within the printed circuit board. For example, test point 94 at the VCC pin of the integrated circuit 66, test point 95 at the VCC pin of integrated circuit 68, and test point 96 at the VCC pin of integrated circuit 70 provide access to the +5 volt DC path 62. Similarly, test points 97, 98 and 99 provide access to the ground voltage path 64 at the ground pins of integrated circuits 66, 68 and 70. It can thus be appreciated that to apply power to the circuit of FIG. 3, test probes 94, 95, and 96 could be connected to the +5 volt line 132 from electronic assembly power supply 111 of FIG. 1 and test probes 97, 98, and 99 could be connected to the 0 voltage line 131 from electronic assembly power supply 111 of FIG. 1. By closing relay 113 power would be supplied to the printed circuit board. Power would be supplied in this manner for the truth table testing of integrated circuits 66, 68, and 70 as various binary values were applied to input signal leads and individual output signals measured by the digital measurement unit 109 (see FIG. 1).

At some point in time during the automatic testing of the electronic assembly under test, an isolated test point test can be conducted while the electronic assembly is still positioned within test probe fixture 102 of FIG. 1. It is important to note that the isolated test point test must be run without disturbing the electronic assembly under test within the test probe fixture so that the test results of the isolated test point reflect the status of the test probe contact with their corresponding test points as seen by the other tests run by the automatic test equipment. In the preferred embodiment, the isolated test point test is run before any other automatic tests so that the isolation of test points may be checked prior to initiating another test, the results of which may become very unreliable if there are too many isolated test points. The particular number of isolated test points which will be tolerated in a given test is a function of the complexity of the circuit, the number of components involved, and the time involved in correlating each isolated test point detected with other failures detected by other tests (e.g., digital and analog) executed on the ATE. As an example, it has been found practical to abort from any further automatic testing when eight isolated test points are determined in testing a TTL level PCB containing approximately 200 integrated circuits. In this case, the isolated points are reported on the printer attached to the automatic test equipment for possible use in maintenance of the test probe fixture 102 or the cleaning of the PCB before retesting.

The isolated test point testing of the example printed circuit board 104 of FIG. 3 will now be discussed in detail. In order to perform the isolated test point test on the example PCB 104 illustrated in FIG. 3, the automatic test equipment 100 of FIG. 1 must be programmed to check for the isolation of test points 80 through 99. This programming process consists of writing a test program which is executed by tester logic 106 to inject a test pulse at each test point and check for a response at a set of common test points. Therefore, one of the first steps in writing a test program is to examine the electronic assembly to be tested and determine a set of common test points which are most likely to be test points to which every other test point on the board will have at least an AC current path to. In the instant example, the examination of the printed circuit board 104 of FIG. 3 reveals that most test points will have at least an AC current path to the +5 volt DC path and the ground voltage path. Therefore, test points 94, 95, and 96 which are connected to the VCC pins of the integrated circuits and test points 97, 98, and 99 which are connected to the ground pins of the integrated circuits will be used as sets of common test points. Therefore the test is written such that test points 80 through 93 will be tested against common test points 94 through 99. It being noted that test points 94 through 99 are not tested to determine whether they are isolated because these test points 94 through 96 have a direct path on the PCB 104 itself as do test points 97 through 99. Further, it is assumed that at least one of these multiple test probes will be in contact with their corresponding test points on the electronic assembly under test. It should be noted that in the test probe fixture 102 of FIG. 1 that the test probes corresponding to test points 94, 95, and 96 are wired together within the test probe fixture 102 as are the test probes corresponding to test points 97, 98, and 99. This wiring together of the subsets of the common test points within test probe fixture 102 makes it possible to select only one of the test probes of the subsets of the common points within the test program and eliminates the need to individually test other test point within the subset of common test points.

Because the detection of isolated test points is done without power applied to the board within the test program itself, the program will be written such that no power will be applied to the 5 volt path or the ground path of the board and only test pulses will be applied to these paths. That is, returning to FIG. 1 for a moment, the test program will be written such that the relays associated with the electronic assembly power supply 111, relays 113 and 115, would remain open during the isolated test point detection phase of testing the electronic assembly under test 104. In addition to not applying power from the electronic assembly power supply 111, it is essential that the electronic assembly under test be electrically isolated from the ATE 100 in all respects except for the test probe connections made for the purpose of isolated test point detection.

The automatic test program is written such that a positive voltage pulse is injected at all common test points and the individual test point whose isolation is being checked is measured to detect for a response to the positive voltage pulse. If no response is received at the test point whose isolation is being checked, the process is reversed and the positive voltage pulse is injected at the individual test point and a response is measured at first one subset of the common test point and if no response is detected then the positive voltage test pulse is again injected at the test point whose isolation is being checked and a response is measured at a second subset of the common test points and this process of injection at the test point whose isolation is being checked and measuring at the subsets of common test points is continued until all subsets of common test points have been exhausted or until a response is detected. During this testing process of an individual test point the first time a response to the positive voltage test pulse is detected the test proceeds to the next test point to be checked for isolation.

For example, in the case of the PCB 104 of FIG. 3 and the use of the automatic test equipment of FIG. 1, the test to check test point 80 to determine whether it is isolated would be as follows. The test program executed by tester logic 106 would be written such that the relays corresponding to relay 136 of all test probe driver/receivers for the test probes corresponding to test points 80 through 99 would be closed and all relays corresponding to relays 137, 138, and 139 in the test probe driver/receivers would be opened. Closing of the relays corresponding to relay 136 will initialize the equipment such that the test probes may be switched to either the test probe power supply 110 or the digital measurement unit 109. The opening of the relays corresponding to relays 137, 138, and 139 will ensure that the test probes are not connected to the analog measurement unit 108. Now looking at the testing of test point 80, the test program will be written such that the positive voltage pulse is injected at the common test points and the response at test point 80 is measured. To do this, the relays corresponding to relay 133 for the test probes associated with test points 94, 95, 96, 97, 98, and 99 will be programmed to momentarily close, for example, for 10 microseconds. This sends a 10 microsecond pulse of +5 volts DC to each of the common test probes. The voltage level of this positive voltage pulse is controlled by the test program by directing test probe power supply 110 to supply a specified positive voltage level. In practice, with TTL circuits, a +5 volt DC pulse is used. The relay corresponding to relay 135 for the test probe which should be in contact with test point 80 is then programmed to close such that the test probe for test point 80 will be connected to the digital measurement unit 109 via line 123. Digital measurement unit 109 is programmed to detect any voltage level above a certain threshold voltage. In the case of TTL circuits which are being test injected with a +5 volt DC pulse, any response greater than +3 volts have been found to be sufficient to indicate that the test probe is in contact with its corresponding test point. The difference between the test pulse voltage level and the threshold voltage level is a function of the circuitry of the digital measurement unit 109. It should be noted that although all the relays corresponding to relay 133 for the common test points have been programmed to pulse momentarily to inject the positive voltage pulse at the common test point that in actuality only one of each subset of the common relays need be programmed to so close because the other test probes will receive the positive voltage pulse because all test probes of a common subset are wired together within test probe fixture 102. Therefore, for example, only the relay corresponding to relay 133 for test probes 94 and 97 need be programmed to pulse because 94 is wired to 95 and 96, and 97 is wired to 98 and 99.

Because there is the possibility that the current paths from the individual test point whose isolation is being checked to the common test points is unidirectional and will allow current to flow in only one direction, the checking of test point 80 is also done by injecting the positive voltage test pulse at test point 80 and measuring for a response at the common test points thereby reversing the current flow. To reverse the current flow, the relay corresponding to relay 133 for test point 80 is programmed to close momentarily, for example, 10 microseconds such that the +5 volt DC test pulse will be injected at test point 80. The relay corresponding to relay 135 for the test probe driver/receiver associated with test point 94 is then programmed to close such that the response to the positive voltage test pulse may be detected at the first subset of common test points. The test is then programmed to again inject the positive test pulse at test point 80 by again closing the relay corresponding to relay 133 for test probe 80 and to close the relay corresponding to relay 135 for test probe 97 such that a response to the positive test pulse may be monitored at the second and last subset of common test points. The test is written such that in the testing for the isolation of an individual test point the moment a response to the positive voltage test pulse is measured by digital measurement unit 109 the test proceeds to the next individual test point to be tested.

The test program for test point 81 is then written in a similar manner such that the positive voltage test pulse is injected at test points 94 through 99 and is measured at test point 81 and if no response is detected the program is written such that the positive voltage test pulse is injected at test point 81 and measured at test point 94 and, if a response not exceeding the programmed threshold is not sensed, then the positive test pulse is again injected at test point 81 and measured at test point 97. The test program is written such that if no response is sensed which exceeds the programmed threshold during the testing of an individual test point, the tester logic 106 will report that the test point is isolated by displaying the number of the isolated test probe on test result display 107. The program is similarly written to check test probes 82 through 93.

Once the isolated test point test program is written so that each individual test point, other than the common test points, will be checked for isolation, the test program is combined with the larger test program to be executed by the automatic test equipment which will check other aspects of the electronic assembly. For example, as mentioned earlier, the isolated test point test would be combined with tests for: shorts within the PCB, continuity of circuit paths, analog tests, orientation tests, and digital or truth table testing of the components.

After a test program has been written, the operation of the test program can then be verified by executing the test program against a known good electronic assembly to find any errors that may have been written into the test program. In the example of the printed circuit board 104 of FIG. 3, if the isolated test point program is run against a known good electronic assembly to check that isolated test point program is properly written, a test point may be reported as being isolated. For example, assuming that the test probe for test point 80 is bent and not in contact with test point 80, the running of the isolated test point program will result in the reporting of test point 80 as being isolated. It would further report that test point 82 is isolated. An examination of these logic diagrams (FIGS. 2 and 3) shows that test point 80 is in fact marginally connected to the common test points which are the VCC and ground pins of the integrated circuits. It should be noted that these marginal-connecting paths of test point 80 to the common test points is not shown in FIG. 3 but would be found if the detailed schematic diagrams of the integrated circuits 66, 68, and 70 are studied. Having determined that test point 80 should not be isolated, the test probe associated with test point 80 would be examined and any problem of alignment or other cause of the contact failure would be corrected before the use of the automatic test equipment to test electronic assemblies of unknown quality.

In addition to reporting that test point 80 is isolated, the test program would also report that test point 82 is isolated. An examination of FIG. 3 will reveal that test point 82 is in fact an isolated test point on the printed circuit board with no path at all to any of the common test points. This situation would be handled by rewriting the test program so as not to check for the isolation of test point 82 or by instructing the interpreter of the test results to ignore the reporting of test point 82 as being isolated.

Figure 1A:
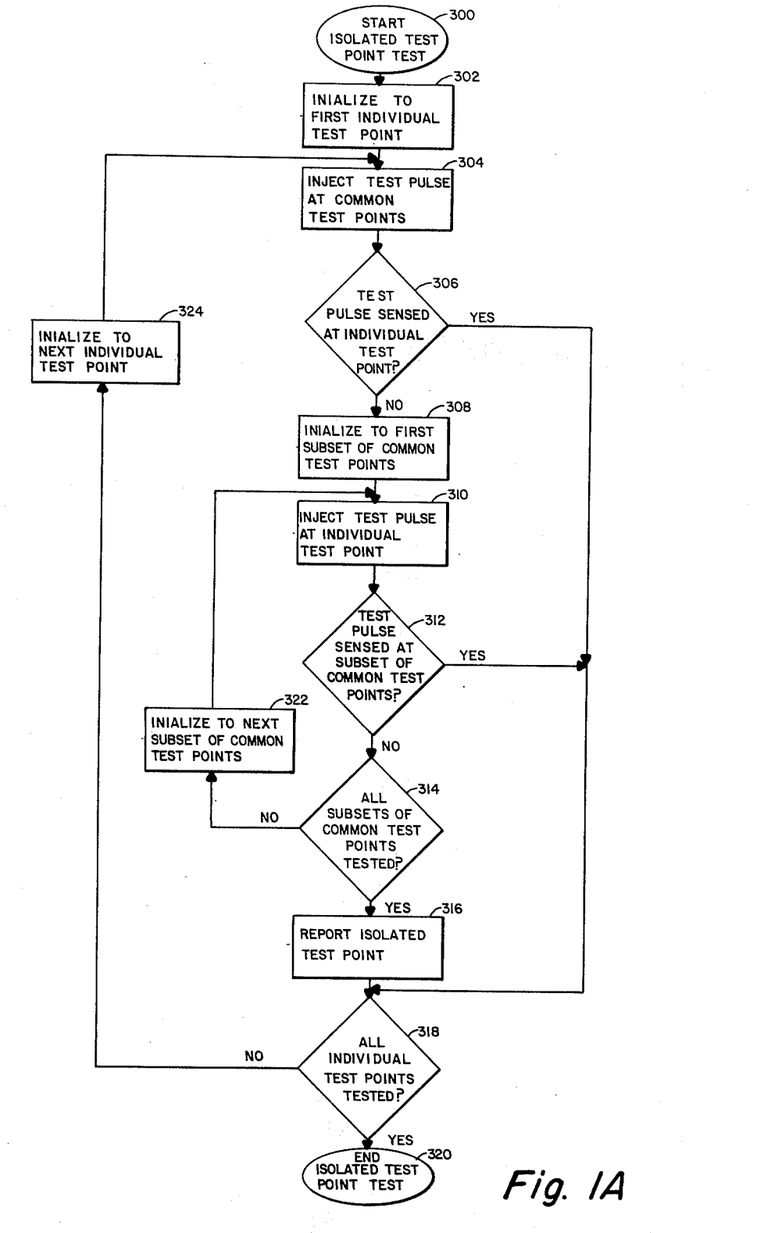
FIG. 1A is a block diagram of the method of the present invention as practiced by the ATE device of FIG. 1.

The above method of testing for isolated test points may best be appreciated by referring to FIG. 1A. The isolated test point test is initiated in block 300 which would isolate the electronic assembly under test from the electronic assembly power supply 111, initialize the test probe power supply 110 for the proper test pulse and initialize digital measurement unit 109 to the proper threshold voltage. Block 302 initializes the automatic test equipment to the first of the individual test points to be tested. In the case of the PCB 104 of FIG. 3, this would initialize to test point 80. Block 304 injects the test pulse at the common test points. Again in the example case of the PCB of FIG. 3, the test pulse would be injected at test points 94 and 97, and because these points are wired together in the test probe fixture 102 the test pulse would also be injected at test points 95, 96, 98, and 99. In block 306 a response to the test point is measured at the individual test point to see whether it exceeds the predetermined threshold. If there is a response exceeding the predetermined threshold, block 306 exits to block 318.

If no response above the predetermined threshold is received at any of the common test points, block 306 exits to block 308 which initializes the test to the first subset of common test points. Again in the example of the PCB 104 of FIG. 3, this would initialize to test point 94 which is a subset in common with test points 95 and 96. In block 310 the test pulse is injected at the individual test point. Block 312 measures to determine whether a response to the test pulse was sensed at the first subset of the common test points. If a response above the predetermined threshold was sensed, block 312 exits to block 318. If a response below the threshold was received at the subset of common test points, block 312 exits to block 314 which checks to determine if all subsets of common test points have been checked.

If all subsets of common test points have not been checked, block 314 exits to block 322 which initializes the test to the next subset of common test points. Again for the example of the PCB 104 of FIG. 3, this would initialize to the subset of common test points having test point 97 as one of the points. Block 322 then exits to block 310 in which the test pulse is injected at the individual test point which in turn exits to block 312 to test whether the response to the test pulse was measured at the subset of common test points which would be test point 97 at this time. If no response above the threshold was measured at test point 97, block 312 again exits to block 314 which would check to see whether all subsets have been tested and, because in the example only two subsets exist, the answer would be yes and block 314 would exit to block 316. In block 316 the test point number of the isolated test point would be reported, for example, by a printer. Alternately, the automatic test equipment may be able to correlate which electronic components are associated with the test point which failed and report that a failure of one of these associated components in a later testing phase may in fact be related to the isolation of the test point and not due to a component failure. Block 316, after reporting the isolated test point, then exits to block 318 which determines whether all individual test points have been tested. Again in the example of FIG. 3, it would check to determine whether point 93 had been tested and if not, it would exit to block 324. In block 324 the test is initialized to the next individual test point and then proceeds to block 304 to test that individual test point. If block 318 determines that all individual test points have been tested, block 318 exits to block 320 which is the end of the isolated test point test.

Empirical data indicates that for TTL level circuits, the vast majority of test points are coupled closely enough to at least one of the common test points so that testing using a single current flow direction is both useful and practical. Therefore the test program of FIG. 1A can be simplified in these cases by eliminating blocks 308, 310, 312, 314, and 322 and having block 306 exit directly to block 316. Elimination of these blocks from FIG. 1A will reduce the size of the test program but will not reduce the time required to execute the isolated test point test because the eliminated blocks are only executed if a test point would fail the simplified test thereby indicating that the test point is isolated or that there is only a unidirectional high impedance path between between the test point and the common test points.

As mentioned hereinbefore, variations to this isolated test point program may be used whereby the test program keeps track of the number of isolated test points found in a test and before ending determines whether the number of detected isolated points has exceeded a predetermined threshold. If the number of detected isolated test points exceeds the threshold number, the test program could abort any further testing of the electronic assembly because the result will be too unreliable due to the number of test probes which are not in contact with their associated test points.

Normally, using automatic test equipment of the type illustrated in FIG. 1 and testing electronic assemblies of the printed circuit type illustrated in FIG. 3, following an isolated test point test a test for shorts would be conducted. This test would be conducted by applying a positive voltage level at an individual test point to be checked to determine if it is shorted with the other test points and measuring at each of the other test points to see whether substantially the same voltage level is detected. Shorts test may use a constant voltage level as opposed to pulsing the point as was done in the isolated test point test. This shorts test is also distinguished from the isolated test point test in that each test point is tested against all other test points and not just against a set of common test points. However, the shorts test must take into account those points which are actually shorted together either within the electronic assembly under test or within the test probe fixture. For example in the PCB 104 of FIG. 3, test point 94 is shorted to test points 95 and 96 on the PCB itself and also the corresponding test probes are wired together within test probe fixture 102. Similarly, test point 97 is shorted with test points 98 and 99, and the corresponding test probes within test probe fixture 102 are also wired together. Therefore, the test shorts program will be written so that test points 95, 96, 98, and 99 are not individually tested. As in the case of the isolated test point test, the shorts test may be set up such that the further testing of the electronic assembly is aborted if shorts are found because the results of the other tests will be too adversely impacted if the shorts exist on the electronic assembly under test.

Following the shorts test, an analog test would be run on capacitor 44 and resistors 46 and 60 of the example PCB of FIG. 3. Again as in the case of the isolated test point test and the shorts test, the analog test would be conducted without power applied to the electronic assembly. Following the completion of the above tests, power would be applied to the board and an orientation test and a digital (truth table) test would be performed on the electronic assembly. For some electronic assemblies in which there are sufficient test probes available, it is possible to do a continuity test between test points which is very similar to the shorts test but in the continuity test, the test is being performed to verify that there is a low impedance path between the test points. In the continuity test a positive voltage is applied to one test point and the voltage is measured at all other test points which are directly connected to the first test point. The continuity test is a low impedance test. In the example electronic assembly illustrated in FIG. 3, there have not been placed sufficient test points to conduct a continuity test and therefore the continuity test was omitted from the above sequence of tests.

As mentioned hereinbefore in practicing the isolated test points method with an automatic test equipment device of the type illstrated in FIG. 1, when testing electronic assemblies which consist of printed circuit boards containing TTL level logic components, a test pulse that goes from 0 to +5 volts DC for a period of 10 microseconds has been found to be adequate. The response to this test pulse is measured by digital measurement unit 109 which is a high impedance measuring circuit with an input impedance in excess of 100 megohms. In using this +5 volt DC pulse with TTL level logic components a threshold minimum of +3 volts has been found to be the desirable level. A minimum threshold level of +3 volts was determined by emperical tests which show the use of a threshold level below +3 volts will result in test points which are isolated not being reported as isolated because digital measuring unit 109 would see enough of a response to the test pulse due to the various capacitance within the automatic test equipment and/or ambient noise.

The limitations of this high impedance measuring technique can be appreciated when considered in attempting to test an electronic assembly containing a triode vacuum tube. If the grid of the triode vacuum tube is not connected to any other component in the electronic assembly under test and is simply connected to, for example, an edge connector of a printed circuit board and the plate and cathode of the triode vacuum tube are connected to other components on the electronic assembly, it would be unlikely that this isolated test point detection technique could sense the connection of the test probe to the test point on the grid of the triode vacuum tube. This inability to sense is caused by the extremely high impedance between the grid and other points on the electronic assembly. The impedance between the grid and other test points would be something of the order of the impedance that would be found between test points when no test electronic assembly was in place within the test probe fixture due to the wiring capacitance within the automatic test equipment itself. Cases of this type can be accommodated within the isolated test point test by simply adding a second test point placed somewhere on the signal path connected with the first test point which would otherwise have only a high impedance path to all other test points. This additional test point could then be included within the common test points. The first test point, which would otherwise appear to be isolated would now not be isolated from the second test point and would not be reported as an isolated test point if the test probes associated with the first test point and the additional test point were in contact with their associated test points. Because cases of this type are rare in most electronic assemblies, there will normally be sufficient spare test probes available such that the one or two cases of this type may be accommodated without exceeding the total number of test probes available within the ATE.

The purpose of using a high impedance detection circuit to measure the response to the test pulse is to detect extremely small amounts of current passing between the individual test point and the other points so that the test will not report the individual test point as being isolated. The higher impedance of the detection circuit, the greater percentage of the voltage will drop across the detection circuit and therefore require less sensitivity (i.e., in discriminating between voltage levels) on its part.

The purpose of reversing the polarity of the voltage of the test pulse is for those cases which may exist in which the impedance in one direction is so high that only a small amount of current will pass. The sensing circuit in such a case would not sense the response to the test pulse whereas it would if the polarity of the test pulse were reversed.

It is also recognized that the test pulse generator as previously described may be replaced by circuitry limited to unidirectional pulsing, to single or multiple frequency AC oscillation, or even a simple DC level, with satisfactory results in many applications. A DC pulse was selected as the preferred method of stimulus generation due to its containing AC components over a wide frequency spectrum.

Although the present invention has been described in terms of testing TTL level printed circuit boards using automatic test equipment, it is envisioned that many of the principles of the present invention can be employed with respect to different types of electronic assemblies which are automatically or manually tested while held in other types of fixtures intended to make temporary electrical contact with the electronic assembly for testing purposes. Further, it will be appreciated by those skilled in the art that many changes may be made in the illustrative embodiment without departing from the spirit and scope of the invention.

Having described the invention, what is claimed as new and novel and for which it is desired to secure Letters Patent is:

1. A method of determining test probe electrical contact isolation when utilizing a test apparatus, said test apparatus having a test fixture having a plurality of test probes for making temporary electrical contact with an electronic assembly to be tested by said test apparatus, said electronic assembly having electric circuits formed therein, said plurality of test probes for making electrical contact with a plurality of points within said electric circuits, said test apparatus comprising a stimulation means, a sensing means, and a test probe selection means, the method comprising the steps of:

a. selecting a set of common probes from said plurality of test probes, said set of common probes being associated with common points of said plurality of points, said common points being points within said electric circuits that are associated with electrical conductors carrying signals that are widely distributed throughout said electronic assembly such that there exists an electrical path between each non-common point of said plurality of points and at least one of said common points;
   b. electronically isolating said electronic assembly from said test apparatus;
   c. selecting a one of said plurality of test probes;
   d. electrically stimulating said set of common probes by said stimulation means;
   e. sensing said one of said plurality of test probes by said sensing means for a response to said electrical stimulation;
   f. determining if said sensing means detected an electrical signal in response to said electrical stimulation above a predetermined threshold and if so, selecting a next one of said plurality of test probes to be said one of said plurality of test probes and returning to step d. if all of said plurality of test probes have not been selected, or going to step g. if no electrical signal above said predetermined threshold is detected by said sensing means, or completing contact isolation test if all of said plurality of test probes have been selected;
   g. selecting a one of said set of common probes;
   h. electrically stimulating said one of said plurality of test probes by said stimulation means;
   i. sensing a one of said set of common probes for a response to said electrical stimulation;
   j. determining if said sensing means detected an electrical signal in response to said electrical stimulation above said predetermined threshold and if so selecting a next one of said plurality of test probes to be said one of said plurality of test probes and returning to step d., or going to step k. if no electrical signal above said predetermined threshold is detected by said sensing means;
   k. selecting a next one of said set of common probes to be said one of said common probes and returning to step h. if all of said common probes have not been selected, or going to step l. if all of said set of common probes have been selected;
   l. reporting said one of said plurality of test probes as isolated; and,
   m. selecting a next one of said plurality of test probes to be said one of said plurality of test probes and returning to step d. if all of said plurality of test probes have not been selected, or completing contact isolation test if all of said plurality of test probes have been selected.

2. The method of claim 1 wherein said step of selecting said common probes is done by manually examining the circuit of said electronic assembly under test to determine said common points which are at least marginally electrically connected to a plurality of said non-common points of said plurality of points.

3. The method of claim 1 wherein said step of selecting said set of common probes from said plurality of test probes is done by selecting test probes associated with the points within said electric circuits associated with ground and power electric conductors of said electronic assembly under test.

4. The method of claim 3 wherein said step of selecting said set of common probes is done by manually examining the electronic assembly under test to determine if other test probes other than the ground and power test probes should be included in said set of common test probes.

5. The method of claim 1 wherein said electrically stimulating step is performed using a DC pulse of one polarity.

6. The method of claim wherein said electrically stimulating step is performed using a DC level.

7. The method of claim 1 wherein said sensing step is performed using a sensor capable of measuring only a single polarity DC pulse.

8. The method of claim 1 wherein said sensing step is performed using a sensing means capable of detecting only a single polarity DC level.

9. The method of claim 1 wherein said electrically stimulating step and said sensing step are performed using signal levels providing the maximum sensitivity and the least susceptability to noise.

10. The method of determining test probe electrical contact isolation when utilizing a test apparatus, said test apparatus having a test fixture having a plurality of test probes for making temporary electrical contact with an electronic assembly to be tested by said test apparatus, said electronic assembly having electric circuits formed therein, said plurality of test probes for making electrical contact with a plurality of points within said electric circuits, said test apparatus comprising a stimulation means, a sensing means, a test probe selection means, the method comprising the steps of:

a. selecting a set of common test probes from said plurality of test probes, said set of common probes being associated with common points of said plurality of points, said common points being points within said electric circuits that are associated with electrical conductors carrying signals that are widely distributed throughout said electronic assembly such that there exists an electrical path between each non-common point of said plurality of points and at least one of said common points;

b. electronically isolating a said electronic assembly from said test apparatus;

c. selecting a one of said plurality of test probes;

d. electrically stimulating said set of common probes by said stimulation means;

e. sensing said one of said plurality of test probes by said sensing means for a response to said electrical stimulation;

f. determining if said sensing means detected an electrical signal in response to said electrical stimulator above a predetermined threshold and if so, selecting a next one of said plurality of test probes to be said next one of said plurality of test probes and returning to step d. if all of said plurality of test probes have not been selected, or going to step g. if no electrical signal above said predetermined threshold is detected by said sensing means, or completing contact isolation test if all of said plurality of test probes have been selected;

g. reporting said one of said plurality of test probes as isolated; and, h. selecting a next one of said plurality of test probes to be said one of said plurality of test probes and returning to step d. if all of said plurality of test probes have not been selected, or completing contact isolation test if all of said plurality of test probes have been selected.

11. The method of claim 10 wherein said electrically stimulating step is performed by using a stimulation means capable of generating an AC signal.

12. The method of claim 10 wherein said electrically stimulating step is performed using a stimulation means capable of outputting a DC pulse of one polarity followed by a DC pulse of the opposite polarity.

13. The method of claim 10 wherein said electrically stimulating step is performed using a stimulation means capable of outputting a DC level.

* * * * *